US010034246B2

United States Patent
Sharma et al.

(10) Patent No.: US 10,034,246 B2
(45) Date of Patent: Jul. 24, 2018

(54) SYSTEMS AND METHODS TO INCREASE BATTERY LIFE IN AND IDENTIFY MISUSE OF A WIRELESS DEVICE USING ENVIRONMENTAL SENSORS

(71) Applicant: Honeywell International Inc., Morristown, NJ (US)

(72) Inventors: Gourav Sharma, Bangalore (IN); Andrew G. Berezowski, Wallingford, CT (US); Jesse J. Otis, North Haven, CT (US); Jason Michael Farrell, Batavia, IL (US)

(73) Assignee: HONEYWELL INTERNATIONAL INC., Morristown, NJ (US)

( * ) Notice: Subject to any disclaimer, the term of this patent is extended or adjusted under 35 U.S.C. 154(b) by 61 days.

(21) Appl. No.: 15/150,803

(22) Filed: May 10, 2016

(65) Prior Publication Data

US 2017/0332329 A1    Nov. 16, 2017

(51) Int. Cl.
*H04W 52/02* (2009.01)
*H04W 4/70* (2018.01)
*H04W 4/00* (2018.01)
*G01R 31/36* (2006.01)

(52) U.S. Cl.
CPC .... *H04W 52/0258* (2013.01); *G01R 31/3679* (2013.01); *H04W 4/005* (2013.01); *H04W 4/70* (2018.02)

(58) Field of Classification Search
CPC ........... F24F 3/048; F24F 3/056; F24F 3/0442
See application file for complete search history.

(56) References Cited

U.S. PATENT DOCUMENTS

| | | | |
|---|---|---|---|
| 2009/0195356 A1 | 8/2009 | Tuttle | |
| 2012/0210325 A1* | 8/2012 | de Lind van Wijngaarden | H04W 52/0258 718/103 |
| 2014/0239984 A1* | 8/2014 | Alameh | G01D 5/24 324/686 |
| 2014/0277795 A1* | 9/2014 | Matsuoka | G06Q 30/0202 700/291 |

(Continued)

FOREIGN PATENT DOCUMENTS

| | | |
|---|---|---|
| EP | 2 819 481 A1 | 12/2014 |
| JP | 5968253 B2 * | 8/2016 |

OTHER PUBLICATIONS

Extended European search report for corresponding EP patent application 17165306.6, dated Oct. 9, 2017.

*Primary Examiner* — Mohamed Kamara
(74) *Attorney, Agent, or Firm* — Husch Blackwell LLP

(57) ABSTRACT

Systems and methods to increase battery life in and identify misuse of a wireless device using environmental sensors are provided. Some methods can include identifying times during which at least one of a transceiver or a sensing device in the wireless device is operating outside of a low power sleep state, instructing a thermal sensing device in the wireless device to measure ambient temperatures of the wireless device during the identified times, recording the measured ambient temperatures and the identified times in a memory device of the wireless device, identifying a service time of the wireless device corresponding to the identified times, and using the recorded ambient temperatures or the identified service time to optimize the battery life of the wireless device or to identify the misuse of the wireless device.

26 Claims, 1 Drawing Sheet

(56) References Cited

U.S. PATENT DOCUMENTS

| | | | |
|---|---|---|---|
| 2014/0324232 A1* | 10/2014 | Modi | F24F 11/0086 700/278 |
| 2014/0345845 A1* | 11/2014 | Fadell | G05D 23/1902 165/237 |
| 2016/0088563 A1 | 3/2016 | Koo et al. | |

* cited by examiner

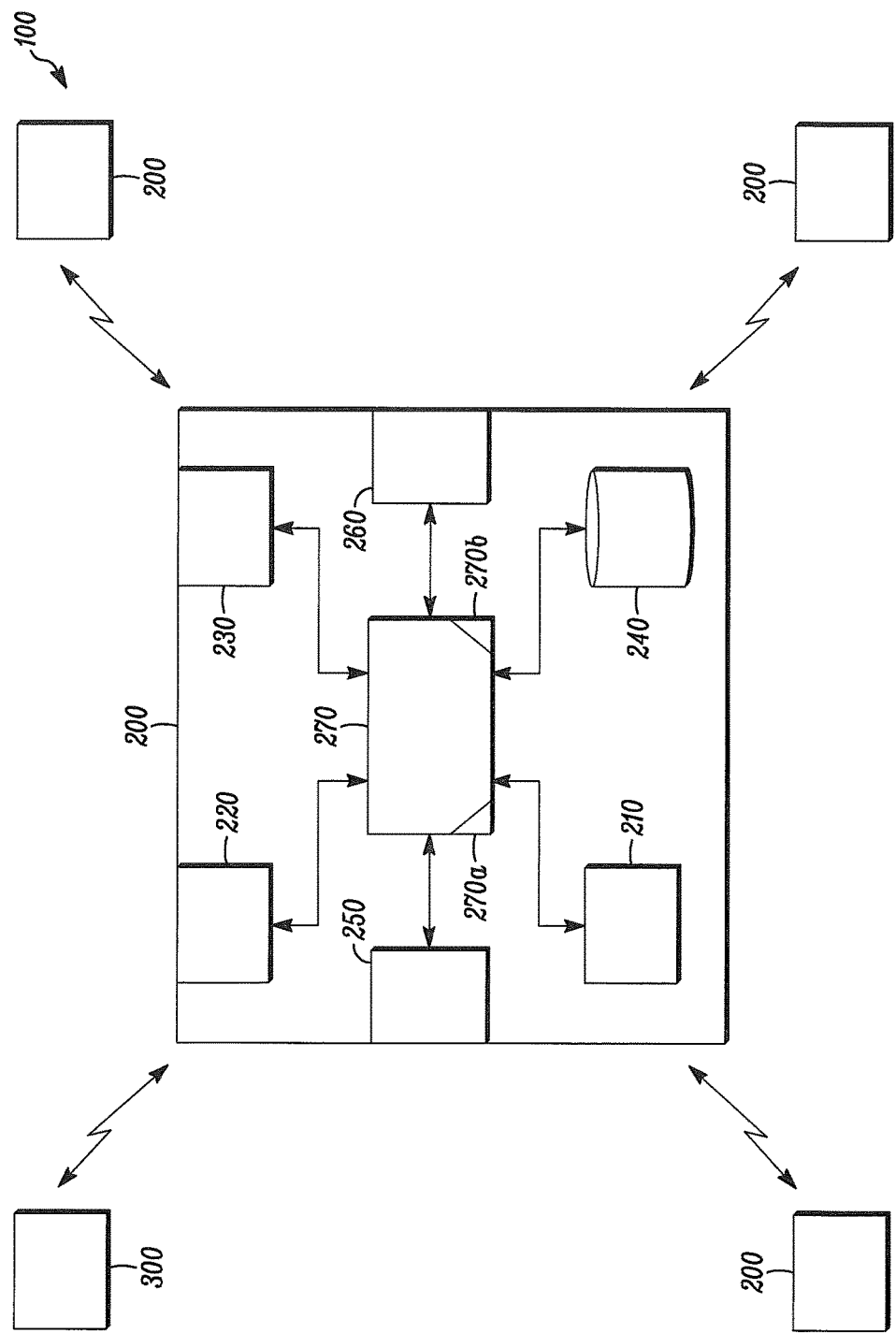

SYSTEMS AND METHODS TO INCREASE BATTERY LIFE IN AND IDENTIFY MISUSE OF A WIRELESS DEVICE USING ENVIRONMENTAL SENSORS

FIELD

The present invention relates generally to wireless devices. More particularly, the present invention relates to systems and methods to increase battery life in and identify misuse of a wireless device using environmental sensors.

BACKGROUND

It is known that an operating environment and a service time of a wireless device will affect a battery life and accordingly, a functional lifespan of the wireless device. For example, late in a life cycle of a battery, operation of the wireless device can vary, which can create a potential for abnormal operation of the wireless device. However, there are no known systems and methods for the wireless device to identify an age of its battery.

Furthermore, it is known that when wireless devices in a system utilize time synchronized wireless communications, each of the wireless devices must be synchronized such that a receiving device of the wireless devices knows in advance when a transmitting device of the wireless devices is going to transmit a signal to the receiving device so that the receiving device wakes up by exiting a low power sleep state at the an appropriate time. However, ambient temperature of a region in which the receiving device is located and the age of any receiving device components, such as, for example, the battery and an oscillator, can impact an accuracy and a tolerance of such synchronization. Accordingly, known systems must account for a worst case ambient temperature and aging of the receiving device components when identifying a tolerance range. Such accounting can require the receiving device to exit the low power sleep state earlier than truly necessary, which can unnecessarily drain the battery life of the receiving device. However, there are no known systems and methods for the receiving device to account for an actual ambient temperature and an actual age of the receiving device components, such as, for example, the battery and the oscillator, when identifying the tolerance range for the synchronization.

Finally, when the wireless device is placed in the operating environment outside of a rated operating range, the wireless device may not function properly. However, there are no known systems and methods for the wireless device to identify and detect such misuse and abuse of the wireless device.

In view of the above, there is a continuing, ongoing need for improved systems and methods.

BRIEF DESCRIPTION OF THE DRAWINGS

FIG. 1 is a block diagram of a system in accordance with disclosed embodiments.

DETAILED DESCRIPTION

While this invention is susceptible of an embodiment in many different forms, there are shown in the drawings and will be described herein in detail specific embodiments thereof with the understanding that the present disclosure is to be considered as an exemplification of the principles of the invention. It is not intended to limit the invention to the specific illustrated embodiments.

Embodiments disclosed herein can include systems and methods to increase battery life in and identify misuse of a wireless device using environmental sensors. In some embodiments, the wireless device can include a thermal sensor that can include an aging identification mechanism. For example, in some embodiments, the thermal sensor can be used to identify and maintain a record of ambient temperature values, including minimum and maximum temperature values, and an ambient temperature profile over time for service time of the wireless device, which can be used to identify aging data for the wireless device. In some embodiments, such identified data and information can be presented to a user during installation or maintenance of the wireless device or when an ambient environment of the wireless device changes during a service life of the wireless device.

In accordance with disclosed embodiments, the wireless device can use such thermal sensor data and the aging data, for example, data indicative of the service time of the wireless device, to identify an age of the wireless device or the wireless device's battery or other components, for example, an oscillator, and accordingly, an expiration date thereof. For example, a duration and a frequency of a time when the thermal sensor records an ambient temperature can be used to identify a time that the wireless device has been in service (the service time), which can correspond to the age of the wireless device and device components. It is to be understood that the service time of the wireless device can be less than or equal to the service life of the wireless device, but in some embodiments, indicative of the service life of the wireless device.

In accordance with disclosed embodiments, the wireless device can use the thermal sensor data and the aging data to effectively tune a drift wait time for transceivers and minimize a window of time during which the wireless device is out of a low power sleep state, for example, when the wireless device is a receiving device in a system that utilizes time synchronized wireless communications, thereby reducing unnecessary receive waiting time for the receiving device. In accordance with disclosed embodiments, the wireless device can also use the thermal sensor data and the aging data to effectively reduce the a drift in a start time for a transmitter in the wireless device, for example, when the wireless device is a transmitting device in the system that utilizes the time synchronized wireless communications. For example, identified temperature profiles and the duration and the frequency of the time when the thermal sensor records the ambient temperature can be used to adjust algorithms that are used in the wireless device to compensate for thermal effects on a sensor of the wireless device.

In accordance with disclosed embodiments, the wireless device can use the thermal sensor data and the aging data to identify and inform the user when the wireless device has been adversely affected or misused during installation of service. For example, some embodiments disclosed herein can identify when the thermal sensor data is indicative of the wireless device being in an environment that has a temperature outside of an allowable temperature range for the wireless device. Such indications can be useful, for example, to resolve warranty disputes related to the wireless device. For example, identified temperature excursions outside of the allowable temperature range and the duration and the frequency of the time when the thermal sensor records the ambient temperature can be used to evaluate an installation environment and to identify whether the wireless device has been properly installed in a controlled environment or in an impermissible location.

The wireless device as described and disclosed herein can have a primary function other than thermal sensing. For example, in some embodiments, the wireless device can include, but is not limited to a security system input or output device, an addressable speaker strobe fire alarm notification device, and the like.

FIG. 1 is a block diagram of a system 100 in accordance with disclosed embodiments. As seen in FIG. 1, the system 100 can include a plurality of wireless devices 200 and a system controller 300, which can include, but is not limited to a control panel, a remote monitoring station, a user device, or another wireless device 200.

Each wireless device 200 can include one or more of a battery 210, a user interface device 220, a transceiver 230, a memory device 240, a thermal sensing device 250, and a sensing device 260 such that the sensing device 260 is related to a function of the wireless device 200 and has a primary function other than thermal sensing. While FIG. 1 shows the battery 210, it is to be understood that the battery 210 can include a self-powered battery or a power line or receiver that receives power from an external power source, for example, when the wireless device 200 includes one or more wired connections.

Each of the battery 210, the user interface device 220, the transceiver 230, the memory device 240, the thermal sensing device 250, and the sensing device 260 can be in communication with control circuitry 270, one or more programmable processors 270a, and executable control software 270b as would be understood by one of ordinary skill in the art. The executable control software 270b can be stored on a transitory or non-transitory computer readable medium, including, but not limited to local computer memory, RAM, optical storage media, magnetic storage media, flash memory, and the like. In some embodiments, the control circuitry 270, the programmable processors 270a, and the executable control software 270b can execute and control at least some of the methods described above and herein.

For example, the control circuitry 270, the programmable processors 270a, and the executable control software 270b can identify times when at least one of the transceiver 230 or the sensing device 260 is operating outside of a low power sleep state and, during those times, can instruct the thermal sensing device 250 to measure ambient temperature. The control circuitry 270, the programmable processors 270a, and the executable control software 270b can also record in the memory device 240 the ambient temperatures measured and times and time windows during which those temperatures were measured.

In some embodiments, the control circuitry 270, the programmable processors 270a, and the executable control software 270b can use the ambient temperatures recorded, associated times, and the time windows recorded during which the ambient temperatures recorded were measured, which can correspond to the times during which the transceiver 230 or the sensing device 260 were in operation, to identify a service time of the wireless device 200, to identify an age, a service life, and an expiration date of the wireless device 200, the battery 210, and the sensing device 260, to tune a drift wait time for the transceiver 230 when the wireless device 200 is a receiving device and the system 100 utilizes time synchronized wireless communications, to tune a drift in a start time for the transceiver 230 when the wireless device 200 is a transmitting device and the system 100 utilizes the time synchronized wireless communications, to adjust algorithms executed by the executable control software 270b that are used to compensate for thermal effects on the sensing device 260, to identify minimum and maximum recorded ambient temperature values, to identify an ambient temperature profile over the service time of the wireless device 200, or to identify whether and a duration of when the wireless device 200 has been exposed to a temperature outside of an allowable temperature range for the wireless device 200.

Additionally or alternatively, in some embodiments, the control circuitry 270, the programmable processors 270a, and the executable control software 270b can transmit, via the transceiver 230, the ambient temperatures recorded, the associated times, and the time windows recorded during which the ambient temperatures recorded were measured to the system controller 300, and control circuitry, a programmable processor, and control software of the system controller 300 can use such received data to identify the service time of the wireless device 200, to identify the age, the service life, and the expiration date of the wireless device 200, the battery 210, and the sensing device 260, to tune the drift wait time for the transceiver 230 when the wireless device 200 is the receiving device and the system 100 utilizes the time synchronized wireless communications, to tune the drift in the start time for the transceiver 230 when the wireless device 200 is the transmitting device and the system 100 utilizes the time synchronized wireless communications, to adjust the algorithms executed by the executable control software 270b that are used to compensate for the thermal effects on the sensing device 260, to identify the minimum and maximum recorded ambient temperature values, to identify the ambient temperature profile over the service time of the wireless device 200, or to identify whether and the duration of when the wireless device 200 has been exposed to a temperature outside of the allowable temperature range for the wireless device 200.

In some embodiments, the user interface device 220 or a user interface device of the system controller 300 can display the ambient temperatures recorded, the associated times, the time windows recorded during which the ambient temperatures recorded were measured, or associated information identified by the control circuitry 270, the programmable processors 270a, and the executable control software 270b of the wireless device 200 or the control circuitry, the programmable processor, and the control software of the system controller 300.

Although a few embodiments have been described in detail above, other modifications are possible. For example, the logic flows described above do not require the particular order described or sequential order to achieve desirable results. Other steps may be provided, steps may be eliminated from the described flows, and other components may be added to or removed from the described systems. Other embodiments may be within the scope of the invention.

From the foregoing, it will be observed that numerous variations and modifications may be effected without departing from the spirit and scope of the invention. It is to be understood that no limitation with respect to the specific system or method described herein is intended or should be inferred. It is, of course, intended to cover all such modifications as fall within the spirit and scope of the invention.

What is claimed is:
1. A method comprising:
identifying power on times during which at least one of a transceiver or a sensing device in a wireless device is operating outside of a low power sleep state;

measuring, via a thermal sensing device, ambient temperatures of the wireless device only during the power on times;

recording the ambient temperatures and associated time values during the power on times in a memory device of the wireless device;

identifying a total service time length of the wireless device corresponding to the power on times; and using the ambient temperatures or the total service time length to optimize a life of a battery of the wireless device.

2. The method of claim 1 wherein using the ambient temperatures or the total service time length to optimize the life of the battery of the wireless device includes identifying an age or an expiration date of the battery.

3. The method of claim 1 wherein using the ambient temperatures or the total service time length to optimize the life of the battery of the wireless device includes tuning a drift wait time or a drift in a start time for the transceiver.

4. The method of claim 1 wherein using the ambient temperatures or the total service time length to optimize the life of the battery of the wireless device includes adjusting a software algorithm used to compensate for thermal effects on the sensing device.

5. The method of claim 1 further comprising:
transmitting the ambient temperatures and the total service time length to a system controller, a mobile device, or a remote wireless device; and
the system controller, the mobile device, or the remote wireless device using the ambient temperatures or the total service time length to optimize the life of the battery of the wireless device.

6. The method of claim 5 wherein the system controller, the mobile device, or the remote wireless device using the ambient temperatures or the total service time length to optimize the life of the battery of the wireless device includes the system controller, the mobile device, or the remote wireless device identifying an age or an expiration date of the battery.

7. The method of claim 5 wherein the system controller, the mobile device, or the remote wireless device using the ambient temperatures or the total service time length to optimize the life of the battery of the wireless device includes the system controller, the mobile device, or the remote wireless device tuning a drift wait time or a drift in a start time for the transceiver.

8. The method of claim 5 wherein the system controller, the mobile device, or the remote wireless device using the ambient temperatures or the total service time length to optimize the life of the battery of the wireless device includes the system controller, the mobile device, or the remote wireless device adjusting a software algorithm used to compensate for thermal effects on the sensing device.

9. A method comprising:
identifying power on times during which at least one of a transceiver or a sensing device in a wireless device is operating outside of a low power sleep state;
measuring, via a thermal sensing device, ambient temperatures of the wireless device only during the power on times;
recording the ambient temperatures in a memory device of the wireless device; and
using the ambient temperatures to identify misuse of the wireless device.

10. The method of claim 9 wherein using the ambient temperatures to identify the misuse of the wireless device includes identifying a minimum value or a maximum value of the ambient temperatures and determining whether at least one of the minimum value or the maximum value is outside of an allowable temperature range for the wireless device.

11. The method of claim 9 further comprising:
transmitting the ambient temperatures to a system controller, a mobile device, or a remote wireless device; and
the system controller, the mobile device, or the remote wireless device using the ambient temperatures to identify the misuse of the wireless device.

12. The method of claim 11 wherein the system controller, the mobile device, or the remote wireless device using the ambient temperatures to identify the misuse of the wireless device includes the system controller, the mobile device, or the remote wireless device identifying a minimum value or a maximum value of the ambient temperatures and determining whether at least one of the minimum value or the maximum value is outside of an allowable temperature range for the wireless device.

13. A wireless device comprising:
a transceiver;
a thermal sensing device;
a memory device;
a battery or a power line; and
a programmable processor and executable control software stored on a non-transitory computer readable medium,
wherein the programmable processor and the executable control software identify power on times during which the transceiver is operating outside of a low power sleep state,
wherein the programmable processor and the executable control software measure, via the thermal sensing device, ambient temperatures only during the power on times,
wherein the programmable processor and the executable control software record, in the memory device, the ambient temperatures and associated time values during the power on times,
wherein the programmable processor and the executable control software identify a total service time length of the wireless device corresponding to the power on times, and
wherein the programmable processor and the executable control software use the ambient temperatures or the total service time length to optimize a life of the battery or the power line.

14. The wireless device of claim 13 wherein the programmable processor and the executable control software use the ambient temperatures or the total service time length to optimize the life of the battery or the power line by identifying an age or an expiration date of the battery or the power line.

15. The wireless device of claim 13 wherein the programmable processor and the executable control software use the ambient temperatures or the total service time length to optimize the life of the battery or the power line by tuning a drift wait time or a drift in a start time for the transceiver.

16. The wireless device of claim 13 wherein the programmable processor and the executable control software transmit to a system controller, a mobile device, or a remote wireless device, via the transceiver, the ambient temperatures and the total service time length, and wherein the programmable processor and the executable control software receive from the system controller, the mobile device, or the remote wireless device, via the transceiver, a signal with instructions to optimize the life of the battery or the power line.

17. The wireless device of claim 16 wherein the signal includes instructions for tuning a drift wait time or a drift in a start time for the transceiver.

18. The wireless device of claim 13 further comprising a second sensing device having a primary function other than thermal sensing.

19. The wireless device of claim 18 wherein the programmable processor and the executable control software use the ambient temperatures or the total service time length to optimize the life of the battery or the power line by adjusting a software algorithm of the executable control software used to compensate for thermal effects on the second sensing device.

20. The wireless device of claim 18 wherein the programmable processor and the executable control software transmit to a system controller, a mobile device, or a remote wireless device, via the transceiver, the ambient temperatures and the total service time length, and wherein the programmable processor and the executable control software receive from the system controller, the mobile device, or the remote wireless device, via the transceiver, a signal with instructions to optimize the life of the battery or the power line.

21. The wireless device of claim 20 wherein the signal includes instructions for adjusting a software algorithm of the executable control software used to compensate for thermal effects on the second sensing device.

22. A wireless device comprising:
    a transceiver;
    a thermal sensing device;
    a memory device;
    a battery or a power line; and
    a programmable processor and executable control software stored on a non-transitory computer readable medium,
    wherein the programmable processor and the executable control software identify power on times during which the transceiver is operating outside of a low power sleep state,
    wherein the programmable processor and the executable control software measure, via the thermal sensing device, ambient temperatures only during the power on times,
    wherein the programmable processor and the executable control software record, in the memory device, the ambient temperatures, and
    wherein the programmable processor and the executable control software use the ambient temperatures to identify misuse of the wireless device.

23. The wireless device of claim 22 wherein the programmable processor and the executable control software use the ambient temperatures to identify the misuse of the wireless device by identifying a minimum value or a maximum value of the ambient temperatures and determining whether at least one of the minimum value or the maximum value is outside of an allowable temperature range for the wireless device.

24. The wireless device of claim 22 wherein the programmable processor and the executable control software transmit to a system controller, a mobile device, or a remote wireless device, via the transceiver, the ambient temperatures, and wherein the programmable processor and the executable control software receive from the system controller, the mobile device, or the remote wireless device, via the transceiver, a signal with instructions to identify the misuse of the wireless device.

25. The wireless device of claim 24 wherein the signal includes instructions indicative of an invalid operation when the system controller, the mobile device, or the remote wireless device identifies a minimum value or a maximum value of the ambient temperatures that is outside of an allowable temperature range for the wireless device.

26. The wireless device of claim 22 further comprising a second sensing device having a primary function other than thermal sensing.

\* \* \* \* \*